US010109480B2

(12) United States Patent
Lee et al.

(10) Patent No.: US 10,109,480 B2
(45) Date of Patent: Oct. 23, 2018

(54) SELECTIVE NANOSCALE GROWTH OF LATTICE MISMATCHED MATERIALS

(71) Applicant: STC.UNM, Albuquerque, NM (US)

(72) Inventors: Seung-Chang Lee, Albuquerque, NM (US); Steven R. J. Brueck, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 15/599,376

(22) Filed: May 18, 2017

(65) Prior Publication Data

US 2017/0256405 A1    Sep. 7, 2017

Related U.S. Application Data

(62) Division of application No. 14/610,254, filed on Jan. 30, 2015, now Pat. No. 9,685,324, which is a division
(Continued)

(51) Int. Cl.
*H01L 21/02* (2006.01)
*C30B 25/04* (2006.01)
(Continued)

(52) U.S. Cl.
CPC ...... *H01L 21/02513* (2013.01); *C30B 23/025* (2013.01); *C30B 25/04* (2013.01); *C30B 25/18* (2013.01); *C30B 25/183* (2013.01); *C30B 29/40* (2013.01); *C30B 29/42* (2013.01); *H01L 21/02381* (2013.01); *H01L 21/02433* (2013.01); *H01L 21/02455* (2013.01); *H01L 21/02458* (2013.01); *H01L 21/02505* (2013.01); *H01L 21/02538* (2013.01); *H01L 21/02546* (2013.01);
(Continued)

(58) Field of Classification Search
CPC ......... H01L 21/02513; H01L 21/02381; H01L 21/02433; H01L 21/02455; H01L 21/02458; H01L 21/02505; H01L 21/02538; H01L 21/02546; H01L 21/02636; H01L 21/02642; H01L 21/02647

See application file for complete search history.

(56) References Cited

U.S. PATENT DOCUMENTS 6,720,196 B2   4/2004  Kunisato et al.
8,227,327 B2   7/2012  Oh
(Continued)

OTHER PUBLICATIONS

S.C. Lee et al., "Lithography-free Nanoscale Patterned Growth of GaAs on Si(001) with Sub-100-nm Silica Nanoparticles by Molecular Beam Epitaxy," American Chemical Society Publications—Crystal Growth & Design, 2011, 11, 3673-3676.
(Continued)

*Primary Examiner* — Mark Tornow
(74) *Attorney, Agent, or Firm* — MH2 Technology Law Group LLP

(57) ABSTRACT

Exemplary embodiments provide materials and methods of forming high-quality semiconductor devices using lattice-mismatched materials. In one embodiment, a composite film including one or more substantially-single-particle-thick nanoparticle layers can be deposited over a substrate as a nanoscale selective growth mask for epitaxially growing lattice-mismatched materials over the substrate.

20 Claims, 3 Drawing Sheets

Related U.S. Application Data of application No. 13/232,629, filed on Sep. 14, 2011, now Pat. No. 8,980,730.

(60) Provisional application No. 61/403,334, filed on Sep. 14, 2010.

(51) Int. Cl.

| | |
|---|---|
| *C30B 25/18* | (2006.01) |
| *C30B 29/40* | (2006.01) |
| *C30B 23/02* | (2006.01) |
| *C30B 29/42* | (2006.01) |
| *H01L 29/06* | (2006.01) |
| *H01L 29/267* | (2006.01) |
| *C30B 7/00* | (2006.01) |

(52) U.S. Cl.
CPC .. *H01L 21/02636* (2013.01); *H01L 21/02642* (2013.01); *H01L 21/02647* (2013.01); *H01L 29/0665* (2013.01); *H01L 29/0688* (2013.01); *H01L 29/267* (2013.01); *C30B 7/005* (2013.01)

(56) References Cited

U.S. PATENT DOCUMENTS

| | | |
|---|---|---|
| 2004/0041164 A1 | 3/2004 | Thibeault et al. |
| 2005/0051766 A1 | 3/2005 | Stokes et al. |
| 2005/0067627 A1 | 3/2005 | Shen et al. |
| 2007/0108466 A1 | 5/2007 | Kryliouk et al. |
| 2009/0181525 A1 | 7/2009 | Park |
| 2010/0320506 A1* | 12/2010 | Varangis ................ C30B 23/02 257/201 |

OTHER PUBLICATIONS

Luryi et al., "New Approach to the High Quality Epitaxial Growth of Lattice-Mismatched Materials," Applied Physics Letters, vol. 49, No. 3, Jul. 21, 1986, pp. 140-142.

S.C. Lee et al., "Strain-Relieved, Dislocation-Free InxGa1-xAs/GaAs(001) Heterostructure by Nanoscale-Patterned Growth," Applied Physics Letters, vol. 85, No. 18, Nov. 1, 2004, pp. 4181-4183.

Sudhir et al., "Effect of Mg, Zn, Si, and O on the Lattice Constant of Gallium Nitride Thin Films," Mat. Res. Soc. Symp. Proc., vol. 482, pp. 525-530, 1998, Materials Research Society.

\* cited by examiner

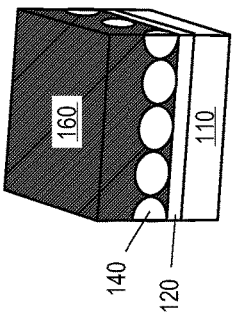
FIG. 1D
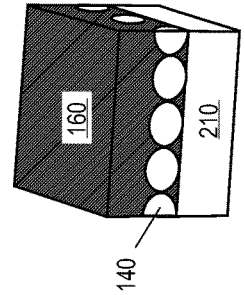
FIG. 2D
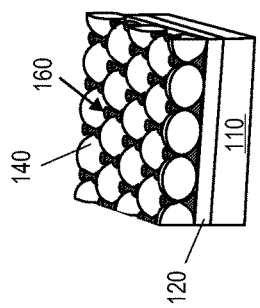
FIG. 1C
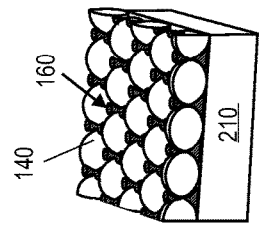
FIG. 2C
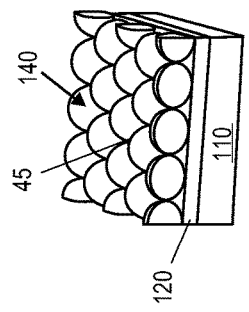
FIG. 1B
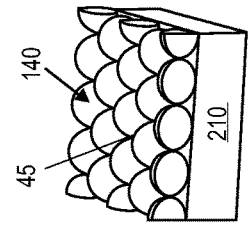
FIG. 2B
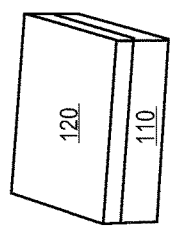
FIG. 1A
FIG. 2A

SELECTIVE NANOSCALE GROWTH OF LATTICE MISMATCHED MATERIALS

RELATED APPLICATIONS

This application is a divisional application of U.S. patent application Ser. No. 14/610,254 filed Jan. 30, 2015, now U.S. Pat. No. 9,685,324 issued Jun. 20, 2017, which is a divisional of U.S. patent application Ser. No. 13/232,629, filed Sep. 14, 2011, now U.S. Pat. No. 8,980,730 issued Mar. 17, 2015, which claims priority to U.S. Provisional Patent Application Ser. No. 61/403,334, filed Sep. 14, 2010, which are hereby incorporated by reference herein in their entireties.

GOVERNMENT RIGHTS

This disclosure was made with Government support under Contract No. 909872 awarded by Sandia National Laboratories. The U.S. Government has certain rights in the invention.

BACKGROUND

High quality epitaxial growth of heterostructures with large lattice mismatched materials is desirable for next generation electrical/optoelectronic devices and multi-functional integrated circuits. Conventional attempts to grow heterostructures such as GaAs on Si with misfit f of about 4.2%, involve methods of using: low-high two step growth with thermal cycling; post growth annealing; strained superlattice buffers; and growth on 2°-off Si(001) and patterned substrates.

Nano-patterned growth (NPG), supported by the Luryi-Suhir model [see Appl. Phys. Lett. 49, 140 (1986)] has been suggested as a potential solution to lattice-mismatched heteroepitaxy. As a result, conventional NPG uses interferometric lithography and dry etching, by which $In_{0.06}Ga_{0.94}As/GaAs$ heteroepitaxy (f~0.4%) has been formed with a pattern period of 335 nm. While there is some controversy about the validity of the model, theoretical calculations suggest that increased misfit in the NPG requires pattern structures smaller than ~100 nm for strain relief without formation of misfit dislocations. However, this scale is beyond the reach of many of large-area lithography techniques.

There remains a need for materials and methods for forming devices over large areas with lattice mismatched materials that are strain-relieved, and have low numbers of defects. Further, while some of currently available lithography techniques such as immersion interferometric lithography may provide a desirable small scale, a need remains for alternative methods to eliminate conventional lithographic processes along with the associated etching and hydrocarbon cleaning steps to simplify the manufacturing process and to reduce the manufacture cost.

SUMMARY

According to various embodiments, the present teachings include a method of forming a semiconductor device. The semiconductor device can be formed by depositing a plurality of nanoparticles to form a composite film including one or more substantially-single-particle-thick nanoparticle layers over a substrate. The composite film can include a plurality of inter-particle spaces. A material lattice mismatched with the substrate can then be epitaxially grown over the substrate through the plurality of inter-particle spaces of the composite film. By continuing epitaxial growth, the material can be laterally coalesced over a top surface of the composite film.

According to various embodiments, the present teachings also include a method of forming a semiconductor device. The semiconductor device can be formed by forming a buffer layer on a Group IV substrate and depositing a plurality of nanoparticles to form a composite film of one or more substantially-single-particle-thick nanoparticle layers on the buffer layer. The composite film can include a plurality of inter-particle spaces that expose portions of the buffer layer. A material lattice mismatched with the substrate can then be epitaxially grown on the exposed portions of the buffer layer through the plurality of inter-particle spaces of the composite film. By continuing epitaxial growth, the material can be laterally coalesced over a top surface of the composite film.

According to various embodiments, the present teachings further include a semiconductor device. The semiconductor device can include a composite film including one or more substantially-single-particle-thick nanoparticle layers disposed over a substrate. Each of the one or more substantially-single-particle-thick nanoparticle layers can include a plurality of nanoparticles having an average diameter d and a plurality of inter-particle spaces having an average lateral dimension s, wherein an aspect ratio d/s ranges from about 0.09 to about 0.3. The semiconductor device can also include an epitaxial material having a lattice mismatch with the substrate. The epitaxial material can be disposed over the substrate through the plurality of inter-particle spaces of the composite film and laterally coalesced over a top surface of the composite film.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the invention.

FIGS. 1A through 1D depict a method of forming an exemplary high-quality semiconductor device at various stages of its fabrication in accordance with various embodiments of the present teachings.

FIGS. 2A through 2D depict another method of forming an exemplary high-quality semiconductor device at various stages of its fabrication in accordance with various embodiments of the present teachings.

DESCRIPTION OF THE EMBODIMENTS

Figure 3A:
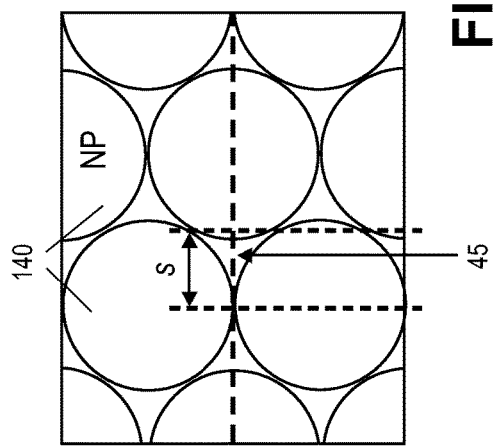
FIGS. 3A and 3B show an exemplary square arrangement of nanoparticles in accordance with various embodiments of the present teachings.

Reference will now be made in detail to exemplary embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide materials and methods for forming high-quality semiconductor devices with lattice-mismatched materials by using a composite film as a selective growth mask. The composite film can include one or more substantially-single-particle-thick nanoparticle layers.

As used herein, the term "high-quality semiconductor device" refers to a semiconductor device that is substantially strain-relieved, defect-free, and in large area such as an entire wafer surface, although lattice-mismatched materials are used. For example, the high-quality semiconductor devices can have a strain relief of less than about 10% of the strain associated with the different bulk lattice constants of the materials and a defect density of about $10^{16}$ cm$^{-2}$ or less.

As used herein, the term "lattice-mismatched" refers to lattice parameters of materials that are mismatched by about 0.5% or more, where a strain including a compressive or a tensile strain can be generated. The degree of the lattice mismatch can be calculated by methods known to one of ordinary skill in the art.

In embodiments, the high-quality semiconductor devices can be formed a variety of crystal growth or epitaxial methods including, but not limited to, molecular-beam epitaxy (MBE), metal-organic chemical vapor deposition (MOCVD), gas source MBE (GSMBE), metal-organic MBE (MOMBE), atomic layer epitaxy (ALE), hydride vapor phase epitaxy (HYPE), and/or organometallic vapor phase epitaxy (OMVPE).

In embodiments, the high-quality semiconductor devices can be formed by one or more materials selected from the group consisting of materials systems of Group III-V, II-VI, VI, III and/or IV. For example, Group III-V materials can include compositions of a Group III element of, e.g., Ga, In and/or Al; and a Group V element of, e.g., As, Sb, N, and/or P. As disclosed herein, by use of a composite film including substantially-single-particle-thick nanoparticle layer(s), various lattice-mismatched materials can be formed in a semiconductor device with high-quality. Exemplary lattice-mismatched material pairs can include Group III-V/Group IV, such as GaAs/silicon, AlGaAs/silicon, etc.; Group III-V/Group III-V such as GaAs/GaSb, III-Sb/InP, etc.; or any other lattice-mismatched material pairs.

FIGS. 1A through 1D depict a method of forming an exemplary high-quality semiconductor device at various stages of its fabrication, and FIGS. 2A through 2D depict a method for forming another exemplary high-quality semiconductor device in accordance with the present teachings. As shown, exemplary high-quality semiconductor devices (see FIG. 1D and/or FIG. 2D) can be formed to include a layered semiconductor material 160 over a substrate 110 or 210, wherein the layered semiconductor material 160 is epitaxially formed and is lattice mismatched with the substrate 110 or 210.

In an embodiment of FIG. 1A, the substrate 110 can be, for example, a Group IV substrate including a Si substrate and/or a Ge substrate. The silicon substrate can include, for example, a (001)-oriented Si substrate or a 2°-off Si(001) substrate, provided for growing lattice-mismatched materials there-over. Alternate orientations of silicon substrates such as (110), (111), and their related faces can also be encompassed in accordance with various embodiments of the present teachings. In one embodiment, the silicon substrate can be an oxide-free Si substrate.

In embodiments, a buffer layer 120 can be formed on the substrate 110. The buffer layer 120 can have a thickness that is sufficient to avoid issues with oxygen contamination of the underlying Si surface during the deposition of the nanoparticle growth mask. The thickness of the buffer layer 120 can range from about 10 nm to about 1000 nm, such as about 100 nm. In one embodiment, the thickness of the buffer layer can be about 2 times the diameter of the nanoparticles used (see 140 in FIG. 1B). Depending on the materials used for the substrate 110 and the mismatched epitaxial material 160, the buffer layer 120 can be formed of various materials including, for example, Group III-V or III-N materials of GaAs, InP, GaSb, InSb, GaN, InAs, and/or other suitable materials.

In embodiments, various other substrates can be used to form the disclosed semiconductor devices. For example, as shown in FIG. 2A, a substrate 210 can be used, including Group III-V substrates. Exemplary Group III-V substrate can include GaAs, InP, GaSb, InSb, InAs, and/or other binary III-V materials. In some embodiments, buffer layers (such as GaAs) can also be used to grow lattice mismatched materials such as InGaAs over a Group III-V substrate such as a GaAs substrate.

Over the substrate 110 or 210, nanoparticles 140 can be deposited or otherwise applied to form a nanoparticle layer that is a substantially-single-particle-thick, as shown in FIG. 1B or FIG. 2B, although occasional extra particle(s) may be included. In one embodiment, the nanoparticles 140 can be deposited or applied by a coating or printing process from a nanoparticle colloid. Exemplary coating process can include a dip coating, an evaporation coating, and/or a spin-coating process. During the coating process, the colloidal concentration and/or spin speed can be adjusted to form the desired single-particle-thick nanoparticle layer on the buffer layer 120 or on the substrate 210. In embodiments, the nanoparticles 140 can be self-assembled. Following application of the nanoparticles 140, the plurality of nanoparticles can be dried or optionally heated to form the substantially-single-particle-thick nanoparticle layer. Optionally, further heating can be performed to remove organic contaminants. The application of nanoparticles 140, e.g., by coating and/or printing without using lithography, can provide low cost deep submicron application to large areas.

The substantially-single-particle-thick nanoparticle layer(s) formed by the nanoparticles 140 can form a composite film and allow for exposure of the underlying layers (see 120/210) through inter-particle spaces 45 of the composite film. The inter-particle spaces can also be referred to herein as open areas. The nanoparticles 140 can thus provide a particle pattern in nanoscale for a selective growth of epitaxial materials (see 160) from the exposed surfaces of the buffer layer 120 or the substrate 210. In embodiments, the nanoparticles 140 can be deposited or arranged, for example, in arrays, such as, in an array of square, hexagonal, pentagonal, and/or any suitable configurations generated by steric effects during the deposition. For example, when using a monodisperse colloidal solution containing nanoparticles with the same size, hexagonal arrays can be formed. When colloidal solution containing nanoparticles with size variation, complex arrangements including hexagonal, square, pentagonal, etc. can be formed. In some cases, there can be defects (e.g., akin to grain boundaries) between regions that have nucleated independently and without a precise distance or orientation between them. In one example, the nanoparticles 140 can be arranged on the buffer layer 120 or the substrate 210 having portion(s) in a square array and portion (s) in a hexagonal array.

Figure 3B:
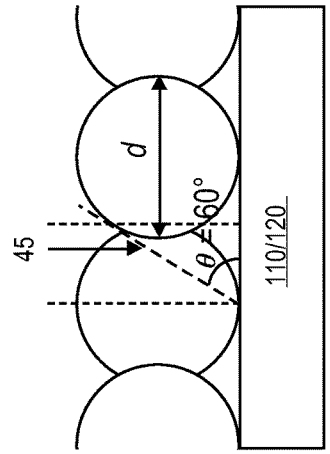
Figure 4A:
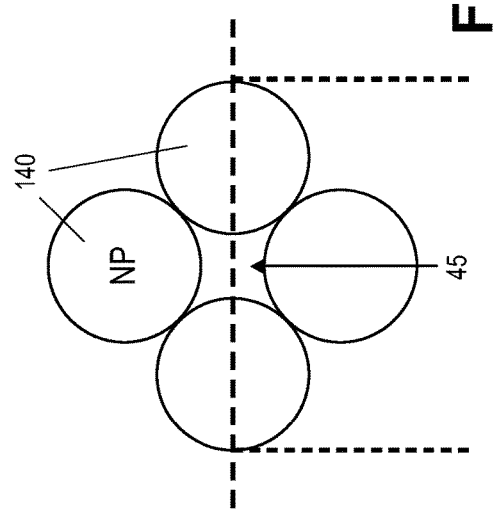
FIGS. 4A and 4B show an exemplary hexagonal arrangement of nanoparticles in accordance with various embodiments of the present teachings.
Figure 4B:
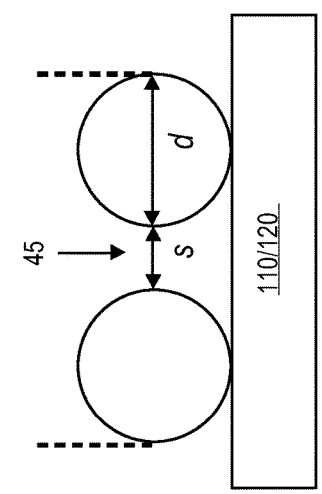

FIGS. 3A and 3B respectively depict a top view and a cross-section view of nanoparticles 140 in an exemplary square array; while FIGS. 4A and 4B respectively depict a top view and a cross-section view of nanoparticles 140 in an exemplary hexagonal array in accordance with various embodiments of the present teachings. Note that although the nanoparticles 140 in FIGS. 1B-1D, FIGS. 2B-2D, FIGS. 3A-3B, and FIGS. 4A-4B are depicted as spherical particles, various embodiments can include nanoparticles in any suitable shapes including, cubic particles, cylindrical particles, ellipsoidal particles, and combinations thereof.

The nanoparticles 140 can have an average diameter d or an equivalent of less than about 200 nm, for example, ranging from about 5 nm to about 150 nm, while the inter-particle spaces 45 can have an average lateral dimension s between adjacent nanoparticles. Depending on the arrangement, dimensions, and the shapes of the nanoparticles 140, the inter-particle spaces 45 can have an average lateral dimension s of less than 200 nm, for example, ranging from about 1 nm to about 100 nm, or ranging from about 5 nm to about 50 nm. In embodiments, the plurality of inter-particle spaces can include an average lateral dimension s ranging from d/3 to d. In one embodiment for spherical particles having a diameter d in a hexagonal lattice, the inter-particle open spaces can have an average lateral dimension s of about ⅓ of the diameter d.

As used herein, the term "lateral dimension" of an inter-particle space, denoted as "s" in FIGS. 3A-3B and 4A-4B, refers to a dimension of the inter-particle space in a direction along the surface and in a direction lined up with a center point of at least one adjacent nanoparticle. The lateral dimension of the inter-particle spaces 45 can also be referred to as an "opening width" of the substantially-single-particle-thick nanoparticle layer(s).

In embodiments, an exemplary monodisperse hexagonal particle array (see FIGS. 4A-4B) can have dense packing and high aspect ratio. The ratio of the open area (see 45) to the total area can be available from simple trigonometry. The top down fraction of the open area is $$\left(1 - \frac{\pi}{2\sqrt{3}}\right) = 0.093,$$

and the aspect ratio, the ratio of the diameter of the nanoparticle to the lateral (or linear) dimension of the open area d/s can be [2/(√3−1)]=2.73. Similarly for a square arrangement (see FIGS. 3A-3B), the open area fraction is (1−π/4) =0.215 and the aspect ratio can be about 1. Other configurations which arise as a result of variations in the nanoparticle size and steric hindrances as the substantially a single monolayer forms can have larger open areas and smaller aspect ratios. The material 160 can be lattice mismatched with the substrate 110 and 210 as respectively shown in FIGS. 1C and 2C.

In embodiments, use of the substantially-single-particle-thick nanoparticle layer(s) can filter out or block propagating defects such as misfit dislocations and stacking faults, and provide highly improved crystallinity of the epitaxial growth. The substantially-single-particle-thick nanoparticle layer(s) can have an open area ratio, $(s/d)^2$, ranging from about 0.09 to about 0.3. In an experimental example, substantially-single-particle-thick nanoparticle layer(s) having an open area ratio $(s/d)^2$ of about 0.17 and/or an aspect ratio (d/s) of about 2 can be sufficient to neck out most of the defects propagating from a GaAs substrate or a GaAs buffer layer (on a silicon substrate) along a GaAs facet of {111}. Roughly this requires an aspect ratio larger than $\sin^{-1}(2/\sqrt{3}) \approx 0.81$, so that both the hexagonal and square lattices/arrays can have a sufficient aspect ratio to eliminate the great majority of the defects.

The nanoparticles 140 can be formed of a material including, but not limited to, silica, silicon nitride, alumina, sapphire, and/or other suitable nanoparticles. Exemplary silica nanoparticles can be available with a range of sizes and varying degrees of monodispersion. Silica nanoparticles can have an exemplary diameter of about 6 nm or less.

In embodiments, the substantially-single-particle-thick nanoparticle layer(s) can include combinations of nanoparticles having various levels of particle size/diameter. In embodiments, multiple substantially-single-particle-thick nanoparticle layers, same or different in each layer, can be stacked together as a selective growth mask for the epitaxial growth of the material 160. The multiple substantially-single-particle-thick nanoparticle layers can be stacked by aligning or connecting corresponding inter-particle spaces through the multiple substantially-single-particle-thick nanoparticle layers to expose the underlying layer such as the buffer layer 120 or the substrate 210. In one example, the open areas or the inter-particle spaces can be reduced along the height of the multiple substantially-single-particle-thick nanoparticle layers.

Figure 5:
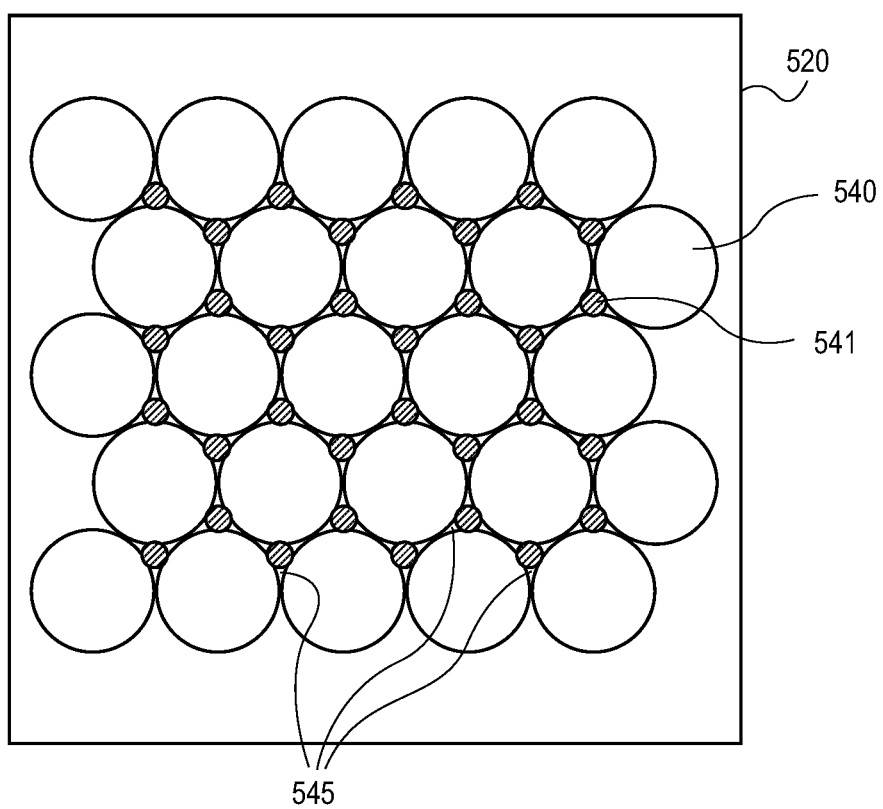
FIG. 5 depicts a top view of an exemplary nanoparticle arrangement with two different size levels in accordance with various embodiments of the present teachings.

For example, FIG. 5 depicts a top down view of an exemplary double layer arrangement of the substantially-single-particle-thick nanoparticle layers. As shown, FIG. 5 can include a first layer formed by a plurality of large nanoparticles 540 over a substrate 520 including such as, for example, the buffer layer 120 or the substrate 210. A second layer formed by a plurality of small nanoparticles 541 can be disposed on the first layer. The large nanoparticles 540 can have an average particle size ranging from about 50 nm to about 150 nm such as about 100 nm. The small nanoparticles 541 can have an average particle size ranging from about 5 nm to about 40 nm or from about 6 nm to about 20 nm. In one embodiment, the small nanoparticles 541 can have an average particle size of about 27 nm. In embodiments, the large nanoparticles and small nanoparticles can be combined in a single deposition and/or in consecutive depositions to provide various array combinations of the nanoparticles and to control or reduce the open areas or the inter-particle spaces.

The lattice mismatched material 160 can then be selectively grown through the inter-particle spaces 45 of the composite film composed of the one or more substantially-single-particle-thick nanoparticle layer(s) from the buffer layer 120 (see FIG. 1C) or the substrate 210 (see FIG. 2C). Any suitable epitaxial methods, such as MBE, can be used. Once the lattice mismatched material 160 has been grown to fill the inter-particle spaces 45, lateral growth of the material 160 can continue and then coalesce until it substantially covers a top surface of the composite film composed of the plurality of substantially-single-particle-thick nanoparticle layer(s), as shown in FIGS. 1D and 2D. In embodiments, a portion of the laterally coalesced material 160 on the composite film of the substantially-single-particle-thick nanoparticle layer(s) can have a thickness of at least several times the nanoparticle diameter or between d and 10 d for example, about 1 µm. The final growth thickness depends on specific device, for example, the epitaxial layers for laser devices are thicker than those for field-effect transistor (FET) devices.

In embodiments, the material 160 mismatched with the substrate 110 (e.g., a silicon substrate), or the substrate 210 (e.g., a Group III-V substrate) can be, for example, a Group III-V material including, but not limited to, GaAs, InP, GaSb, InSb, InAs, and/or other suitable materials. In embodiments, the lattice mismatched material pairs of the material 160 over the substrate 110/210 can include, but are not limited to, GaAs/silicon, InGaAs/silicon, GaSb/silicon, InSb/silicon, InP/silicon, GaN/silicon, InAs/silicon, AlGaAs/silicon, AlAs/silicon, InGaSb/silicon, III-Sb/GaSb, III-Sb/InSb, III-Sb/GaAs, III-Sb/InP, III-N/GaAs, III-N/GaSb, GaN/GaAs, InAs/GaAs, GaSb/GaAs, AlGaAs/GaSb, AlAs/GaAs, or InGaSb/InP, and vice versa. It is also possible to grow lattice matched heterostructures atop the layered semiconductor material 160 as is well known in the art.

In this manner, due to use of the composite layer including one or more substantially-single-particle-thick nanoparticle layers, high-quality layered semiconductor material 160 can be formed over a lattice mismatched substrate (110, 210) without using conventional lithography.

In embodiments, additional layers can be epitaxially grown on the high-quality, layered semiconductor material 160. For example, these additional layers can be lattice-matched or strain compensated with the material 160 of the high-quality layered semiconductor material 160. The additional layers can be formed of Group III-V, II-VI, VI, III and/or IV materials. The additional layers can be used to form various active regions including, for example, vertical cavity devices such as vertical cavity surface emitting lasers (VCSEL), vertical-external-cavity surface-emitting-laser (VECSEL), etc. on the high-quality, layered, semiconductor material (see 160). Additionally the layered semiconductor material can be designed for electronic devices such as heterostructure FETs.

The following examples primary relate to formation of an exemplary nanoscale selective growth of GaAs on Si by use of silica nanoparticles in accordance with various embodiments of the present teachings and are not to be taken as limiting the disclosure or claims in any way.

EXAMPLES

GaAs was grown by molecular beam epitaxial (MBE) on a Si(001) substrate that was coated with a dense, substantially-single-particle-thick stack of silica nanoparticles (NPs) having a diameter of about 80 nm. This nanoparticle layer was characterized by about 20 nm to about 40 nm inter-particle spaces, which are small enough for nanoscale selective heteroepitaxial growth of about 4.2% lattice-mismatched GaAs on Si. The epitaxial growth was performed in several steps: growing a 100-nm thick GaAs buffer layer on an oxide-free Si substrate at about 450° C.; ex situ spin-coating nanoparticles over the GaAs buffer layer; and/or growing about 1 µm-thick GaAs over the nanoparticle layer at about 600° C. in a selective growth mode, as described below in great details.

First, the 100-nm thick GaAs buffer layer was deposited on an oxide-free, nominally (001)-oriented Si substrate at about 450° C. by molecular beam epitaxy (MBE). This thick GaAs buffer layer was grown on a clean Si surface to avoid any issues with oxygen contamination of the Si surface during the spin-coating. In other examples, however, such as for forming GaSb on GaAs, the GaAs buffer layer is not necessary since the GaAs surface is stable to the environmental exposures involved in the deposition of the nanoparticle layer.

Then, the sample including silicon substrate was unloaded from the growth chamber after the buffer layer deposition and then covered with silica NPs by spin coating. The NP configuration resulting from the spin-coating was a mixture of square and hexagonal arrays due to the size and shape fluctuations of the nanoparticles in this example. The colloidal concentration and spin speed were adjusted to form the substantially-single-particle-thick stack of NPs on the GaAs buffer layer. After baked at about 110° C. for about 10 minutes to drive off any residual organic contaminants, the sample covered with the NP layer was reloaded into the growth chamber to selectively grow GaAs on the GaAs buffer layer. The growth temperature was increased to about 600° C. and the growth rate was set to about 0.03 monolayer (ML)/sec for the selective epitaxy of GaAs on the GaAs buffer layer through the inter-particle spaces or voids in the NP layer.

In one example, for a square packed spherical nanoparticles (NPs) (d=80 nm) coated along the GaAs buffer surface, a lateral dimension s of the inter-particle spaces was about 40 nm. The nanoscale selective growth was then effectively performed on the 80 nm-period $SiO_2$ particles with the 40 nm opening in each period. According to a calculation based on Luryi-Suhir model, this particle pattern was enough to form GaAs on Si. Specifically, at the given growth condition, nanoscale selective growth was available over this NP layer since the surface migration length of a Ga atom on $SiO_2$ surface for the exemplary growth rate of about 0.1 ML/sec was about 200 nm at about 600° C., greater than $\pi d/2$ of about 120 nm (the distance from the top of a NP to the GaAs surface along the NP surface). In the continued growth, GaAs was grown through the inter-particle spaces and ultimately covering the nanoparticles by lateral growth and coalescence. The selectively grown GaAs had a thickness of about 1 µm.

This selective nanoscale growth was different than conventional low-high two-step growth in that, the GaAs buffer layer was used to cover the clean Si surface to avoid the oxidation during ex situ nanoparticle coating. Additionally, the exemplary selective growth of GaAs through the nanoscale openings in the composite film composed of one or more substantially-single-particle thick layers filtered out the propagating defects such as dislocations and stacking faults during its formation.

SEM and TEM images and XRD data depicted that the selectively grown GaAs over the NP layer proceeded with island formation at an initial stage but covered the entire NP layer with single crystalline GaAs by epitaxial lateral growth and coalescence. This is because use of NP layers with small opening, high aspect ratio in nanoscale selective growth necked and filtered out the defects. The process was simple and involved only a few, conventional processing steps. The absence of any nanoscale lithographic steps made it inexpensive and accessible. Exemplary results have been presented in Lee et al. "Lithography-free Nanoscale Patterned Growth of GaAs on Si(001) with sub-100-nm Silica Nanoparticles by Molecular Beam Epitaxy," Crystal Growth and Design 11, 3673-3677 (2011), which is incorporated by reference herein in its entirety.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A semiconductor device comprising:
   a substrate;
   a composite film comprising one or more substantially-single-particle-thick nanoparticle layers disposed over the substrate,
      wherein the composite film comprises a plurality of nanoparticles, self-assembled such that a plurality of inter-particle spaces are defined between adjacent ones of the plurality of nanoparticles,
      wherein the inter-particle spaces are smaller than an average nanoparticle diameter of the plurality of nanoparticles, and
      wherein the one or more substantially-single-particle-thick nanoparticle layers is sterically-limited such that each of the plurality of nanoparticles is contacted by multiple additional ones of the plurality of nanoparticles; and
   an epitaxial material grown through the plurality of inter-particle spaces from a surface below the one or more substantially-single-particle-thick nanoparticle layers, wherein the epitaxial material is laterally coalesced over a top surface of the composite film, and wherein the epitaxial material has a lattice mismatch with the substrate.

2. The device of claim 1, further comprising one or more additional epitaxial layers disposed on the epitaxial material that is laterally coalesced over the top surface of the composite film to form an active region of a heterostructured semiconductor device, wherein the one or more additional epitaxial layers are lattice matched with the laterally coalesced material.

3. The device of claim 1, wherein the substrate comprises a Group III-V substrate comprising GaAs, GaSb, or InAs, and the epitaxial material lattice mismatched with the substrate comprises a different Group III-V material than the Group III-V substrate.

4. The device of claim 1, further comprising a buffer layer disposed between the substrate and the composite film, wherein the substrate comprises a Group IV substrate, and each of the buffer layer and the epitaxial material lattice mismatched with the substrate comprises a Group III-V material comprising GaAs, GaSb, GaN, InAs, or InSb.

5. The device of claim 1, wherein the plurality of nanoparticles are formed of a material selected from the group consisting of silicon oxide, silicon nitride, aluminum oxide, and a combination thereof.

6. The device of claim 1, wherein the one or more substantially-single-particle-thick nanoparticle layers comprise a first layer comprising a plurality of large nanoparticles having an average particle size ranging from about 50 nm to about 150 nm over the substrate, and a second layer comprising a plurality of small nanoparticles having an average particle size ranging from about 6 nm to about 20 nm disposed on the first layer.

7. The device of claim 1, wherein the plurality of nanoparticles comprise an average particle size ranging from about 5 nm to about 150 nm in diameter.

8. The method of claim 1, wherein the substantially-single-particle-thick nanoparticle layer consists essentially of a plurality of nanoparticles having an average particle size ranging from about 80 nm to about 150 nm in diameter.

9. The device of claim 1, wherein the substantially-single-particle-thick nanoparticle layer consists essentially of a plurality of nanoparticles having an average particle size ranging from about 5 nm to about 80 nm in diameter.

10. The device of claim 1, wherein the plurality of nanoparticles have an average diameter d and the plurality of inter-particle spaces have an average lateral dimension s, wherein an aspect ratio d/s ranges from about 0.09 to about 0.3.

11. The device of claim 1, wherein the substantially-single-particle-thick nanoparticle layer is formed from one or more of silica, silicon nitride, alumina, and/or sapphire.

12. The device of claim 1, wherein the inter-particle spaces are small enough to allow nanoscale selective heteroepitaxial growth of the epitaxial film on the substrate.

13. The device of claim 1, wherein the epitaxial material contacts the substrate and comprises a molecular beam epitaxy (MBE)-grown epitaxial material.

14. The device of claim 1, further comprising a buffer layer disposed between the composite film and the substrate, wherein the surface comprises a surface of the buffer layer, wherein the epitaxial material comprises a lattice mismatched material selectively grown through the inter-particle spaces from the surface of the buffer layer.

15. The device of claim 1, wherein the surface comprises a surface of the substrate, and wherein the epitaxial material comprises a lattice mismatched material selectively grown through the inter-particle spaces from the surface of the substrate.

16. The device of claim 1, wherein the one or more substantially-single-particle-thick nanoparticle layers comprises a first substantially-single-particle-thick nanoparticle layer and a second substantially-single-particle-thick nanoparticle disposed on the first substantially-single-particle-thick nanoparticle layer,
- wherein the first substantially-single-particle-thick nanoparticle layer comprises a first plurality of self-assembled nanoparticles,
- wherein the second substantially-single-particle thick layer comprises a second plurality of self-assembled nanoparticles,
- wherein the first plurality of self-assembled nanoparticles consists of large self-assembled nanoparticles having an average particle size ranging from about 50 nm to about 150 nm, and
- wherein the second plurality of nanoparticles consists of small self-assembled nanoparticles having an average particle size ranging from about 5 nm to about 40 nm.

17. A semiconductor device comprising:
- a substrate;
- a composite film comprising one or more substantially-single-particle-thick nanoparticle layers disposed over the substrate,
  - wherein the composite film comprises a plurality of nanoparticles, self-assembled such that a plurality of inter-particle spaces are defined between adjacent ones of the plurality of nanoparticles, wherein the plurality of inter-particle spaces provide ballistic pathways to a surface below the one or more substantially-single-particle-thick nanoparticle layers, and
  - wherein the inter-particle spaces are smaller than an average nanoparticle diameter of the plurality of nanoparticles; and
- an epitaxial material grown through the ballistic pathways and from the surface, wherein the epitaxial material is laterally coalesced over a top surface of the composite film, and wherein the epitaxial material has a lattice mismatch with the substrate.

18. The semiconductor device of claim 17, wherein the surface comprises a surface of the substrate and wherein the one or more substantially-single-particle-thick nanoparticle layers is disposed directly on the substrate.

19. The semiconductor device of claim 17, further comprising a buffer layer formed on the substrate, wherein the surface comprises a surface of the buffer layer, and wherein the one or more substantially-single-particle-thick nanoparticle layers is disposed directly on the buffer layer.

20. A semiconductor device comprising:
- a substrate;
- a composite film comprising one or more substantially-single-particle-thick nanoparticle layers disposed over the substrate,
  - wherein the composite film comprises a plurality of nanoparticles, self-assembled to define a plurality of inter-particle spaces between adjacent ones of the plurality of nanoparticles, wherein the plurality of inter-particle spaces provide open, non-scattering pathways from a top of the one or more substantially-single-particle-thick nanoparticle layers to a surface of the substrate,
  - wherein the one or more substantially-single-particle-thick nanoparticle layers contacts the substrate, and
  - wherein the inter-particle spaces are smaller than an average nanoparticle diameter of the plurality of nanoparticles; and
- an epitaxial material grown from the surface of the substrate through the non-scattering pathways provided by the plurality of inter-particle spaces and laterally coalesced over a top surface of the composite film, wherein the epitaxial material has a lattice mismatch with the substrate.

* * * * *